United States Patent [19]

Sawada et al.

[11] Patent Number: 4,859,811
[45] Date of Patent: Aug. 22, 1989

[54] ELECTRICAL CONDUCTOR

[75] Inventors: Kazuo Sawada; Masanobu Nishio; Yoshihiro Nakai, all of Osaka, Japan

[73] Assignee: Sumitomo Electric Industries, Ltd., Osaka, Japan

[21] Appl. No.: 192,397

[22] Filed: May 10, 1988

Related U.S. Application Data

[62] Division of Ser. No. 25,607, Mar. 13, 1987.

[30] Foreign Application Priority Data

Mar. 18, 1986 [JP] Japan .................................. 61-61898
Jun. 5, 1986 [JP] Japan .................................. 61-131624
Jun. 6, 1986 [JP] Japan .................................. 61-132434

[51] Int. Cl.$^4$ .............................................. H01B 5/02
[52] U.S. Cl. .................................... 174/126.2; 72/47
[58] Field of Search ............... 72/47; 427/69, 91, 117, 427/118, 124, 251; 428/654, 672, 674, 675; 191/22 DM, 29 DM, 33 DM; 174/126 CP, 126.2

[56] References Cited

U.S. PATENT DOCUMENTS

| | | | |
|---|---|---|---|
| 1,810,499 | 6/1931 | Romp | 174/126.2 |
| 2,984,894 | 5/1961 | Hill | 174/126.2 X |
| 3,777,704 | 12/1973 | Van Poucke | 427/251 X |
| 3,926,573 | 12/1975 | Sexton | 428/674 X |
| 4,234,622 | 11/1980 | DuBuske et al. | 427/251 X |
| 4,320,177 | 3/1982 | Anton | 72/38 X |
| 4,525,434 | 6/1985 | Morikawa et al. | 428/674 |

FOREIGN PATENT DOCUMENTS

| | | | |
|---|---|---|---|
| 314791 | 10/1919 | Fed. Rep. of Germany . | |
| 1172922 | 6/1964 | Fed. Rep. of Germany | 428/654 |
| 2937783 | 3/1981 | Fed. Rep. of Germany . | |
| 97514 | 8/1979 | Japan | 428/654 |
| 44742 | 4/1981 | Japan | 428/654 |
| 74249 | 4/1984 | Japan | 428/675 |
| 143040 | 8/1984 | Japan | 428/654 |
| 343163 | 2/1931 | United Kingdom | 174/126.2 |
| 804900 | 11/1958 | United Kingdom | 428/654 |
| 1007260 | 10/1965 | United Kingdom . | |
| 1425754 | 2/1976 | United Kingdom . | |
| 1489510 | 10/1977 | United Kingdom . | |

OTHER PUBLICATIONS

Report No. 12, vol. 21, (1982), from the Japan Institute of Metals, pp. 980–987.
vol. 9, No. 230, (E-343), [1953], Sep. 17, 1985, JAPANESE PATENT ABSTRACT NO.: 60-85546 (A).
vol. 10, No. 168, (E-411), [2224], Jun. 14, 1986; JAPANESE PATENT ABSTRACT NO.: 61-18163 (A).

Primary Examiner—Morris H. Nimmo
Attorney, Agent, or Firm—W. G. Fasse; D. H. Kane, Jr.

[57] ABSTRACT

A conductor has a core wire and a surface coated with the same kind of material as the core wire material. A copper wire (1) which forms the core wire has its surface cleaned by a preparatory processing mechanism (3) and then it is fed to a continuous sputtering unit (4). The continuous sputtering unit (4) coats the surface of the core wire (1) with copper by a coaxial magnetron sputtering method. Thereafter, this wire is drawn, by cold working, into a thin wire of predetermined size.

10 Claims, 2 Drawing Sheets

END VIEW

ELECTRICAL CONDUCTOR

This is a divisional of application Ser. No. 25,607, filed Mar. 13, 1987.

FIELD OF THE INVENTION

This invention relates to an electrical conductor which is required to have a small diameter and high in quality, such as a copper wire used for winding magnet coils, a conductor used in acoustic and image-forming appliances such as stereos or VTR, or a bonding wire for connecting semiconductor elements and transistors for example in integrated circuits.

DESCRIPTION OF THE PRIOR ART

Conventionally, in producing thin metal wires, first an ingot is prepared. The ingot is then subjected to repeated multistage hot and cold working until a thin wire of the desired size is obtained.

As a variation thereof, there is a dip forming process as described, for example, on pages 980–987 of Report No. 12, Vol. 21, (1982) from the Japan Institute of Metals. In this process, a core wire is passed at high speed through a crucible containing molten copper, whereby said core wire is thickened as the molten copper sticking thereto solidifies. Thereafter, the core material is rolled to produce a roughly drawn wire.

The conventional methods described above were each developed as suitable methods for mass production (for example, several tons/hour to tens of tons/hour). Thus, they cannot always be said to be suitable methods, from the standpoint of quality, quality control, and processability, for producing wires such as conductors used for modern electronics which requires high purity, high quality and severe thinning of the wire.

That is, when metal is melted in large quantities, it is impossible to prevent contamination by foreign matter. Further, hot working often causes foreign matter to enter in the vicinity of the metal surface. In the field of very thin wires, wire breakage forms a major factor which impedes productivity. It has been found that most of the wire breaks are caused by foreign matter such as ceramics and iron powders contaminating into the metal during melting and casting or working. Further, a multistage wire drawing process complicates the control of lubricants, dies, and wire drawing machines.

For conductors used for wiring acoustic and image-forming appliances such as stereos and VTRs, it is desirable that conductors contain a minimum of dissimilar elements including such components as oxygen. However, it is difficult to make the entire conductor of high purity copper. The reason is that if, for example, an ingot of high purity copper is remelted or cast, dissimilar elements contaminate or foreign matter often contaminates into the metal during processing, thus making it impossible to maintain the required high purity. This is so because the use of conventional conductors for acoustic and image-forming appliances has made it impossible to obtain sounds or images of good quality.

It is required that bonding wires for connecting semiconductor elements be small in diameter, reliable, and high in quality. Conventionally, as for this type of bonding wires, thin wires of gold, aluminum or copper have been used in practice or investigated for practical use. In the case of a thin wire of gold, its connecting property is good, but there is a problem of high cost. In recent years, to reduce cost by avoiding the use of noble metals, bonding wires of aluminum, aluminum alloy, copper or copper alloy have received attention to see whether such wires could be put into practical use. In the case of a bonding wire to be used for connection, contamination by foreign matter should be avoided to maintain the good connecting property. That is, it is considered desirable to use high purity metal in making bonding wires.

However, high purity metal itself is of high cost. Further, its drawing property is poor because of its lack of strength. For example, in the case of a bonding wire of high purity aluminum, because of its low recrystallization temperature, it is recrystallized by the heat of friction produced during drawing. Further, if an ingot for bonding wires made of high purity metal is remelted and cast, there is the danger of foreign matter contaminating into the metal during processing, thus, making it impossible to maintain the required high purity.

SUMMARY OF THE INVENTION

An object of this invention is to provide a production method capable of obtaining a thin metal wire of high purity and high quality while preventing contamination of foreign matter during production.

Another object of the invention is to provide a bonding wire for connecting semiconductor elements, which is relatively inexpensive and has a superior drawing property while being capable of maintaining its good connecting property, and to provide a method of producing such a wire.

A further object of the invention is to provide a conductor for acoustic and image-forming appliances, which is capable of obtaining sounds and images of good quality, and to provide a method of producing the same.

A conductor according to the invention is characterized in that the surface of a core wire of electrically conductive material is coated with the same kind of material as that of the core wire. The method of producing the conductor according to the invention is characterized in that the surface of a metal core wire is coated with the same kind of metal as the metal core wire by a vapor phase method. In a preferred embodiment, after the surface of the core wire is coated with the same kind of material by a vapor phase method, the core wire is processed by a plastic working unit until it becomes a thin wire of predetermined size.

The coating by a vapor phase method, as compared with that obtained by other coating methods, makes it easy to attain a high quality and cleanliness. Therefore, if a wire, the surface of which has been coated with a clean metal having no foreign matter is drawn by plastic working until it becomes a thin wire of predetermined size, a thin metal wire of high purity and high quality can be obtained while simultaneously reducing wire breakage.

Coating by a vapor phase method and plastic working may be performed alternately and repeatedly. More particularly, the surface of a core in the form of a portion or the whole of the thin metal wire of high purity and high quality obtained by the method described above is coated again with the same kind of metal by a vapor phase method. Thereafter, this wire is drawn by plastic working. If this process is repeated once or a number of times, a very thin wire of high purity and high quality can be obtained. In this case, contamination by foreign matter rarely occurs and wire breakage has been substantially avoided.

According to the method of the invention, a metal core wire of particulary small diameter is prepared and a metal is deposited on its surface by a vapor phase method and then the wire is subjected to plastic working. Therefore, the number of plastic working steps can be reduced. For this reason, if the invention is used for production of thin wires of less than 30 µm, which should be called very thin wires, the control of the manufacturing process can be facilitated because of a reduced number of process steps involved. Further, the processability is good with no excessive force involved in the wire drawing, so that the production efficiency is high. Further, the coating metal can be easily made pure to a great degree.

The term "metal" used in this specification includes an alloy, and the term "same kind" includes not only a combination of the same metal but also such a combination as aluminum and an aluminum alloy. Thus, in the method of the invention, the metal which forms the surface of the metal core wire is the same in its main components as the coating metal. With the arrangement thus made, the wire obtained is electrochemically stable and the danger of corrosion on the end surfaces has been reduced. Further, the adhesion between the core and the deposited coating material is improved.

Regarding the coating by a vapor phase method, physical vapor deposition, such as sputtering, or a chemical vapor deposition, such as plasma CVD, can be used. If the coating is done by sputtering, a wide variety of materials can be deposited on the core wire with high adhesive strength. Coating by chemical vapor deposition uses a gas which can be easily refined, so that deposition with a high purity and a high quality is possible.

Subsequent to the metal coating by a vapor phase method, the plastic working can be performed industrially and conveniently by wire drawing using a cold drawing die. The use of a drawing die enables the plastic working to be performed while enhancing the adhesion between the core and the deposited coating material. In this case, the plastic working is performed in one step so that preferably the percentage reduction in the cross-sectional area is within the range of 15–90%. Plastic working with a percentage reduction of less than 15% would decrease the production efficiency. On the other hand, working with a percentage reduction of more than 90% would impair the softness and elongation property or the resulting wire. Further, it is sometimes difficult to perform plastic working with a percentage reduction of more than 90% for each deposition.

The invention, which achieves the merits described above, is effectively employed for the production of bonding wires for connecting semiconductor elements, conductors for wiring image-forming and acoustic appliances, and magnet wires of copper or aluminum for winding magnet coils.

Preferably, the conductor for acoustic and image-forming appliances is in the form of a copper wire having a purity of 99.99% or above and a surface coated with copper of 99.999% or a purity. The method for producing conductors acoustic and image-forming appliances is characterized in that the surface of copper wire of a purity of 99.99% or above is coated with a copper of a purity of 99.999% or above, by a vapor phase method.

High frequency signal currents in acoustic and image-forming appliances flow in the vicinity of the surface of a conductor because of the skin effect. According to the preferred embodiment described above, high frequency current flows in the high purity copper surface coating rather than in the copper core of lower purity. Therefore, the high frequency current flows under a low AC resistance, without the possibility of a phase difference being caused by the effects of impurity elements. Thus, the use of a conductor for acoustic and image-forming appliances according to the invention makes it possible to obtain sounds and images of good quality.

If the copper coating has a purity of 99.999% or above, the coating operation may be realized by a vapor phase method, by dip plating and wire drawing. However, a vapor phase method is preferred if copper with a purity of 99.999% or above is used for the coating. The coating of the wire core by a vapor phase method as taught herein, makes it easy to control the high purity and cleanliness, as compared with other coating methods. Therefore, the surface of the core can be easily coated with copper of high purity and high quality containing no foreign matter. The vapor phase method as described herein includes a physical deposition, such as sputtering, or a chemical deposition, such as the plasma CVD method, can be employed.

Subsequent to the coating with copper of high purity by the vapor phase method, cold working is performed so that the percentage reduction in cross-sectional area is preferably within the range of 20-90%. This cold working ensures that sounds and images are of high quality. In the case of a percentage reduction of less than 20%, the improvement in sound and image quality would be insufficient. Such improvement will be substantially saturated at a percentage reduction of about 90%. Thus, with a percentage reduction of more than 90%, a satisfactory improvement could not be expected; rather, there would be the danger that the flexibility of the wire is impaired.

The bonding wire for wiring semiconductor elements obtained by the invention is preferably in the form of a thin metal wire of copper, aluminum or gold having a surface coated with the same kind of metal of higher purity. Therefore, this bonding wire will exhibit a good connecting property. As compared with a bonding wire made entirely of high purity metal, the bonding wire of the invention has its surface alone made of high purity metal, so that it is of low cost and superior in its drawing property. Thus, the inner metal of relatively low purity contributes to lowering cost and increasing strength.

The terms "copper," "aluminum," and "gold" include their respective alloys, and the term "same kind," as described above, includes not only a combination of the same metal but also such a combination as aluminum alloy and aluminum.

The coating metal of relatively high purity contributes to improving the connecting property of the bonding wire. For assuring a good connecting property, the coating metal has preferably a purity of 99.99% or above.

The method of producing bonding wires for wiring semiconductor elements according to the invention is characterized in that the surface of a thin metal wire of copper, aluminum or gold is coated with the same kind of metal of higher purity than said thin metal wire by a vapor phase method. Coating by vapor phase method and subsequent wire drawing may be alternately performed several times. In this case, contamination of foreign matter rarely occurs. Wire breakage is also substantially reduced. Therefore, if a thin metal wire of particularly small diameter is prepared and its surface is coated with metal by a vapor phase method and then processed by cold working; the number of process steps can be reduced. Further, the processability is good, not requiring any excessive force for the wire drawing step. Hence, the production efficiency is high.

DESCRIPTION OF THE DRAWINGS

In order that the invention may be clearly understood, it will now be described, by way of example, with reference to the accompanying drawings, wherein.

DESCRIPTION OF THE PREFERRED EMBODIMENTS AND OF THE BEST MODE OF THE INVENTION

EXAMPLE 1

Figure 1:
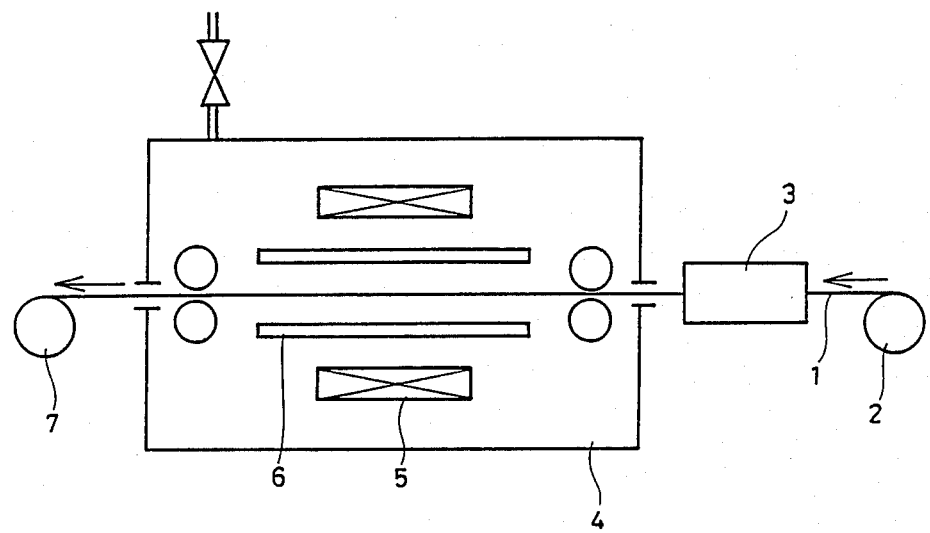
FIG. 1 is a schematic view of an apparatus for performing a coaxial magnetron sputtering method as a wire coating operation.

Using an shown in FIG. 1, the clean surface of a wire of 20 $\mu$m in diameter was coated with copper by a coaxial magnetron sputtering method to provide a round wire of 30 $\mu$m in outer diameter. In FIG. 1, a core wire 1 reeled off a supply mechanism 2 passes through a preparatory processing mechanism 3. The prepared wire 1 then passes through a continuous sputtering unit 4 having magnets 5 and targets 6. The coated wire is taken up by a winding mechanism.

Said round wire was drawn again using a cold working die to reduce its diameter down to 20 $\mu$m. The degree of cold working was 56%. The wire drawing was smoothly effected with very few wire The weight per wire break was 5.3 times the weight achieved when drawing a material obtained by a conventional method. Further, according to the method used in this example, the yield was high.

In a modification, the surface of the wire of 20 $\mu$m in diameter formed in the manner described above, was coated with copper by sputtering to change its outer diameter to 30 $\mu$m whereupon the wire was drawn to change its diameter back to 20 $\mu$m. The result was the same as described above.

EXAMPLE 2

Enamel was applied by baking to the surface of the copper wire of 20 $\mu$m in diameter obtained in Example 1, whereby the wire was processed into a wire for winding magnet coils. The wire thus obtained had a good elongation property. That is, whereas the elongation of a wire obtained by a conventional method was 16%, the wire obtained by the invention exhibited an elongation value of as high as 20% while having substantially the same strength as the wire obtained by a conventional method.

EXAMPLE 3

Figure 2:
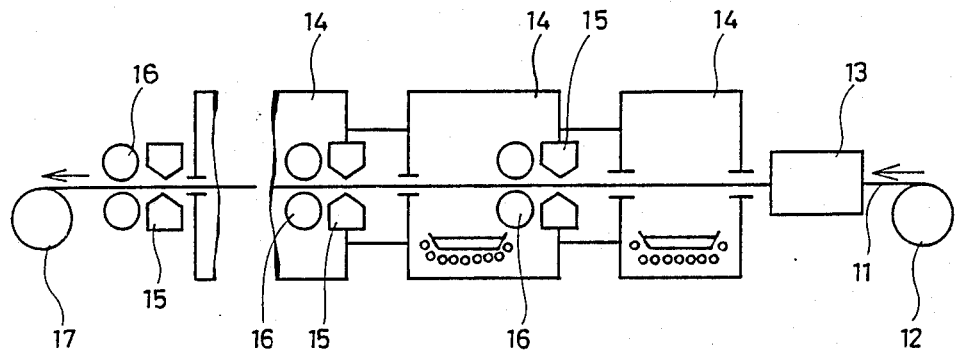
FIG. 2 is a schematic view of an apparatus for performing a vacuum vapor deposition and wire drawing with a die.

Using an apparatus shown in FIG. 2, an aluminum wire of 100 $\mu$m in diameter was produced. A core wire 11 is supplied by a reel mechanism 12 and prepared in a preparatory processing unit 13. The wire is then drawn through a vapor deposition unit 14 followed by die means 15. A driving roller mechanism 16 pulls the wire through each die 15. A winding mechanism 17 winds the wire onto a drum. The dies 15 and the driving rollers 16 may be combined vapor deposition units 14 as shown in the center of FIG. 2.

Specifically, while cleaning the surface of an aluminum wire of 100 $\mu$m in diameter having a purity of 99.99%, aluminum of 99.999% purity was continuously deposited on the wire surface by vapor deposition until the wire diameter was 110 $\mu$m. This wire was continuously drawn through a die 15 to reduce its diameter to 100 $\mu$m. Thereafter, the wire was again subjected to vapor deposition and drawing repetitively, in the same manner, while continuously cleaning its surface. The vapor deposition and drawing were repeated five times until aluminum wire of 100 $\mu$m in diameter was obtained.

The aluminum wire thus obtained was used as a bonding wire for wiring semiconductor elements. This bonding wire was found to exhibit a good corrosion resistance and bonding characteristic.

EXAMPLE 4

Using the apparatus shown in FIG. 1, the surface of a gold wire of 25 $\mu$m in diameter having a purity of 99.99% was coated with the same purity by sputtering until its outer diameter was 30 $\mu$m. The wire thus obtained was drawn to reduce its diameter to 25 $\mu$m and was used as a bonding wire.

In this case also, a plurality of dies can be used for drawing, and it was found suitable to use them in a clean room.

EXAMPLE 5

After the surface of a copper wire of 0.127 mm in diameter having a purity of 99.95% was cleaned surface of this copper wire was coated with copper of 99.999% purity until its diameter was 0.16 mm. Thereafter wire was drawn until its diameter was again 0.127 mm.

A number of thin wires thus obtained were twisted together and insulated. The twisted wire was used for wiring a VTR, and the images and sounds obtained were clear.

EXAMPLE 6

Figure 3:
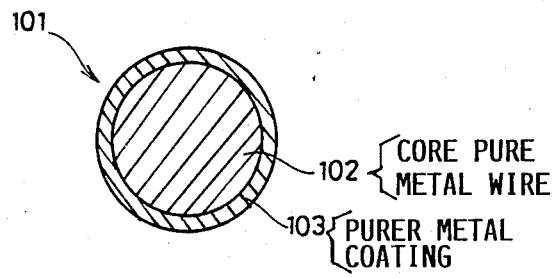
FIG. 3 is a sectional view of a wire obtained according to the invention.

The surface of a copper wire having a purity of 99.99% was coated with copper having a purity of 99.999%, by a vacuum vapor deposition. The conductor thus was cold-worked using a die so that the percentage reduction in cross-sectional area was 70%. FIG. 3 shows the cross-section of the wire 101 thus obtained. The core 102 is copper having a purity of 99.99%, while the surface area 103 is copper having a purity of 99.999%. The outer diameter is 0.12 mm and the thickness of the coat of high purity copper is 0.01 mm.

Figure 4:
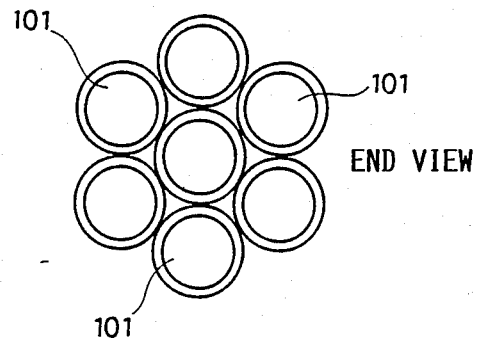
FIG. 4 is an end view of a twisted wire conductor using a conductor shown in FIG. 3.

Seven conductors 101 were twisted for wiring a VTR, please see FIG. 4 showing an enlarged end view. The sounds and images of the VTR were compared with those obtained by an electrical wire formed of conductors of the same diameter made of a soft material of conventional oxygen-free copper. It was found that when the conductor 101 which is an example of the invention obtained in the manner described above was used, the sounds were very rich and clear and the images were clear.

EXAMPLE 7

Figure 5:
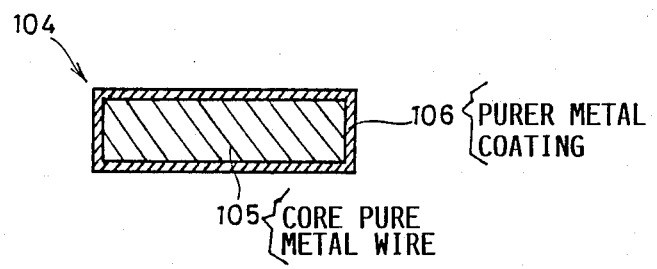
FIG. 5 is a sectional view of a tape-like conductor obtained according to the invention.

The surface of a copper wire having a purity of 99.99% was coated with copper having a purity of 99.99%, by the plasma CVD method to provide a tape-like conduct 104 as shown in FIG. 5. The conductor was then punched and used as a lead wire for transistors in stereos. As compared with a lead wire of conventional oxygen-free copper, the present lead wire provided clear sounds and sound effects of good quality.

EXAMPLE 8

The surface of a thin metal wire of 25 μm in diameter made of Al-1 %Si alloy was coated with aluminum having a purity of 99.999%, by a vacuum vapor deposition to provide a bonding wire of 30 μm in diameter.

Heretofore, it was very difficult to draw a thin aluminum wire made entirely of 99.999% Al, which was used as a comparative material, until its diameter was 30 μm. In contrast, it was easy to draw the bonding wire formed in the manner described above.

The bonding wire thus obtained was used for supersonic wedge bonding, and it was found that its bonding characteristic was superior to that of a bonding wire made entirely of Al-1 %Si alloy.

EXAMPLE 9

The surface of a copper wire of 90 μm in diameter having a purity of 99.99% was coated with copper having a purity of 99.9998%, by sputtering until its diameter was 100 μm. It was then drawn until its diameter was 25 μm for use as a bonding wire. This bonding wire was bonded to an Al vapor deposition electrode by a ball bonding method making a ball by an arc discharge in an Ar atmosphere. It was found that the wedge bonding area between the bonding wire and the ball bonding area and the wedge bonding area between the bonding wire and an Al-plated lead frame portion were both superior in bonding characteristic.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A bonding wire for connecting semiconductor elements comprising a core metal conductor made of a metal having a purity of at least 99.99%, and a conductive metal coating on said core metal conductor, said conductive metal coating being made of the same metal as said core metal conductor, said conductive metal coating having a higher purity than said purity of said core metal conductor, wherein said core metal conductor is made of a metal selected from the group consisting of copper, aluminum and gold, wherein said higher purity of said metal coating is 99.999% or above, and wherein said conductive metal coating and said core metal conductor together have an outer diameter within the range of about 20 μm to about 127 μm.

2. The bonding wire of claim 1, wherein said metal coating comprises several coating layers all of which are made of the same metal.

3. An electrical conductor for conducting electrical currents in an acoustical device or in an image forming device, comprising a core metal conductor made of a metal having a purity of at least 99.99%, and a conductive metal coating on said core metal conductor, wherein said conductive metal coating is made of the same metal as said core metal conductor, said metal coating having a higher purity than said metal conductor, wherein said core metal conductor is made of a metal selected from the group consisting of copper, aluminum and gold, wherein said higher purity of sad metal coating is 99.999% or above, and wherein said conductive metal coating and said core metal conductor together have an outer dimension within the range of about 20 μm to about 127 μm.

4. The electrical conductor of claim 3, wherein said metal coating comprises several coating layers all of which are made of the same metal.

5. The electrical conductor of claim 3, wherein several conductors each with a coated core are twisted together.

6. The electrical conductors of claim 3, wherein said core metal conductor is a flat wire and said metal coating covers all sides of said flat wire to form a tape-type conductor.

7. An electrical conductor comprising an electrical core metal conductor and a conductive metal coating on said core metal conductor, said conductive metal coating being made of the same kind of metal as said core metal conductor, said conductive metal coating having a higher purity than said core metal conductor, and wherein said core metal conductor is a copper metal wire having a purity of 99.99% or above, while said conductive metal coating is copper having a purity of 99.999% or above for conducting electrical currents in an acoustical device or in an image forming device, and wherein said conductive metal coating and said core metal conductor together have an outer diameter within the range of about 20 μm to about 127 μm.

8. The electrical conductor of claim 7, wherein said metal coating comprises several coating layers all of which are made of the same copper.

9. The electrical conductor of claim 7, wherein several wires each with a coated core are twisted together.

10. The electrical conductor of claim 7, wherein said core metal conductor is a flat wire and said metal coating covers all sides of said flat wire to form a tape-type conductor.

* * * * *